United States Patent
Nagasawa (10) Patent No.: US 7,952,371 B2
(45) Date of Patent: May 31, 2011

(54) INTEGRATED CIRCUIT DEVICE HAVING GROUND OPEN DETECTION CIRCUIT

(75) Inventor: Takayuki Nagasawa, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/764,505

(22) Filed: Apr. 21, 2010

(65) Prior Publication Data

US 2010/0271054 A1    Oct. 28, 2010

(30) Foreign Application Priority Data

Apr. 22, 2009 (JP) .................................. 2009-103861

(51) Int. Cl.
*G01R 31/3187* (2006.01)
(52) U.S. Cl. .................................................. 324/750.3
(58) Field of Classification Search .................. None
See application file for complete search history.

(56) References Cited

U.S. PATENT DOCUMENTS

| | | | | |
|---|---|---|---|---|
| 6,150,831 A * | 11/2000 | Asai et al. | ................. | 324/762.01 |
| 7,049,850 B2 * | 5/2006 | Shimizu | ................. | 326/100 |
| 7,609,080 B2 * | 10/2009 | Miller et al. | ................. | 324/757.01 |
| 2002/0063251 A1 | 5/2002 | Sugiura et al. | | |
| 2005/0110526 A1 | 5/2005 | Ishibashi et al. | | |
| 2007/0013383 A1 * | 1/2007 | Parker et al. | ................. | 324/519 |
| 2007/0296455 A1 | 12/2007 | Ishibashi et al. | | |

FOREIGN PATENT DOCUMENTS

| | | |
|---|---|---|
| JP | 11-142462 A | 5/1999 |
| JP | 2001-150688 A | 6/2001 |
| JP | 2002-162448 A | 6/2002 |
| JP | 2005-057677 A | 3/2005 |

\* cited by examiner

*Primary Examiner* — Ha Tran T Nguyen
*Assistant Examiner* — Arleen M Vazquez
(74) *Attorney, Agent, or Firm* — Arent Fox LLP (57) ABSTRACT

An integrated circuit device includes a chip having a power supply terminal, a ground terminal, an input terminal, and an internal circuit formed therein. The chip comprises: a unidirectional device disposed between the input terminal and the ground terminal and directed from the ground terminal to the input terminal; and a ground open detection circuit including a first transistor having the gate connected to the input terminal and the source and the drain connected between the power supply terminal and the ground terminal, a second transistor having the gate connected to the ground terminal and the source and the drain connected between the power supply terminal and the ground terminal, and a comparator for comparing potentials of nodes respectively between drains of the first and second transistors and the power supply terminal, and for outputting a ground open detection signal.

12 Claims, 7 Drawing Sheets

INTEGRATED CIRCUIT DEVICE HAVING GROUND OPEN DETECTION CIRCUIT

CROSS-REFERENCE TO RELATED APPLICATIONS

This application is based upon and claims the benefit of priority of the prior Japanese Patent Application No. 2009-103861, filed on Apr. 22, 2009, the entire contents of which are incorporated herein by reference.

FIELD

The embodiments discussed herein relate to a ground open detection circuit for detecting an open condition of a ground terminal in a chip or a package of an integrated circuit device.

BACKGROUND

An integrated circuit device is configured of a chip having an integrated circuit (LSI) formed therein and a package for accommodating the chip. Power supply terminal, ground terminal and signal terminal on the chip are connected to external terminals of the package. The integrated circuit device is mounted on a circuit board by connecting electrodes of the circuit board etc. to the external terminals of the package by means of soldering etc. Therefore, the power supply terminal and the ground terminal in the chip may have electric connection with an external power supply terminal and an external ground terminal on the circuit board side.

Related art is discussed in Japanese Unexamined Patent Publication No. Hei-11-142462, Japanese Unexamined Patent Publication No. 2002-162448, Japanese Unexamined Patent Publication No. 2005-57677, Japanese Unexamined Patent Publication No. 2001-150688, and so on.

SUMMARY

According to one aspect of the embodiments, an integrated circuit device which includes a chip having a power supply terminal, a ground terminal, an input terminal and an internal circuit is provided. The chip includes: a unidirectional device disposed between the input terminal and the ground terminal and directed from the ground terminal to the input terminal; and a ground open detection circuit including a first transistor having the gate connected to the input terminal and the source and the drain connected between the power supply terminal and the ground terminal, a second transistor having the gate connected to the ground terminal and the source and the drain connected between the power supply terminal and the ground terminal, and a comparator for comparing potentials of nodes respectively between drains of the first and second transistors and the power supply terminal, and for outputting a ground open detection signal indicative of an open condition in which the ground terminal of the chip is not connected to an external ground terminal.

DESCRIPTION OF EMBODIMENTS

When a defective connection is produced between the power supply terminal or the ground terminal of the chip and the corresponding external terminal of the package due to defective assembly, or when a defective connection is produced between the external terminals of the package and the external power supply terminal and the external ground terminal on the circuit board side due to defective soldering, the potential of the ground terminal and the power supply terminal becomes improper, and current is not supplied from the power supply, by which internal circuits of the chip cannot be operated.

Therefore, a defective electric connection may be detected in a test process.

Figure 1:
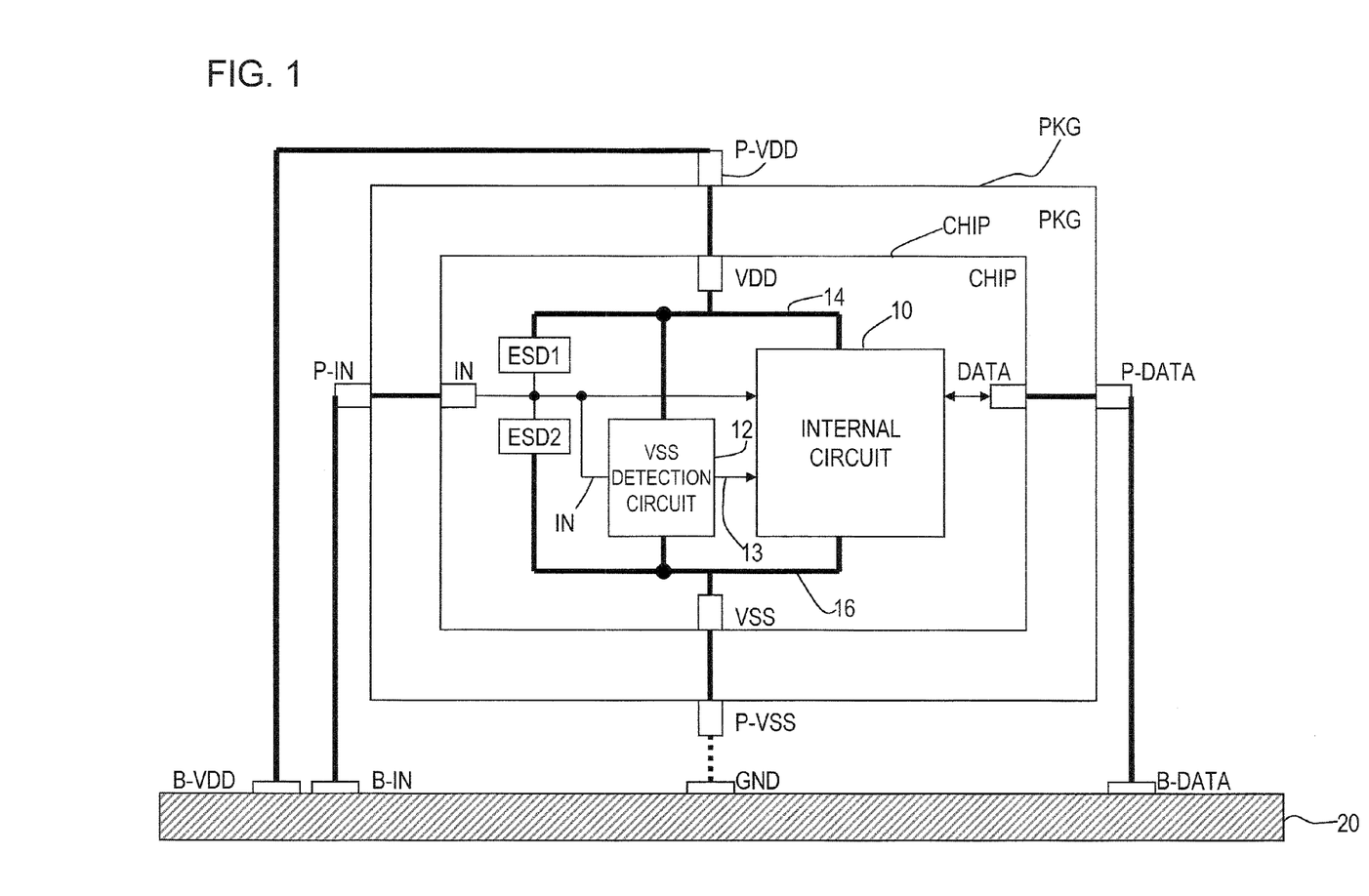
FIG. 1 is a configuration diagram of an integrated circuit device according to a first embodiment.

FIG. 1 is a configuration diagram of an integrated circuit device according to a first embodiment. The integrated circuit device includes a chip CHIP having an integrated circuit formed therein, and a package PKG for accommodating the chip CHIP. The chip CHIP includes power supply terminal VDD, ground terminal VSS, input terminal IN and data input/output terminal DATA. The power supply terminal VDD is connected to a power supply wiring 14, and the ground terminal VSS is connected to a ground wiring 16. Then, based on the input signal being input to the input terminal IN, an internal circuit 10 inputs or outputs data from/to the data input/output terminal DATA.

Terminals VDD, VSS, IN, DATA in the chip CHIP are connected to external terminals P-VDD, P-VSS, P-IN, P-DATA, of the package PKG, respectively. Further, the external terminals P-VDD, P-VSS, P-IN, P-DATA, of the package PKG are connected to terminals B-VDD, GND, B-IN, B-DATA of an external circuit board 20, respectively.

Further, in the chip CHIP, there are provided an electrostatic discharge protection device ESD1 constituted of a unidirectional device such as a diode between the input terminal IN and the power supply terminal VDD for allowing current flow only in the direction from the input terminal to the power supply terminal, and an electrostatic discharge protection device EDS2 constituted of a unidirectional device such as a diode between the input terminal IN and the ground terminal VSS for allowing current flow only in the direction from the ground terminal to the input terminal. Although not shown in the figure, such electrostatic discharge protection devices ESD1, ESD2 are also provided between the data input/output terminal DATA and the power supply terminal VDD, and between the data input/output terminal DATA and the ground terminal VSS, respectively.

Further, according to the present embodiment, in the chip CHIP, a ground open detection circuit 12 is provided for detecting an open condition in which the ground terminal VSS is not electrically connected to the external ground terminal GND. The ground open detection circuit 12 is disposed between the power supply wiring 14 and the ground wiring 16, so as to detect that the potential of the input terminal IN and the potential of the ground terminal VSS become different, when the ground terminal VSS becomes an open condition for some reason.

As for the electrostatic discharge protection devices ESD1, ESD2, when static electricity having a high positive potential is input to the input terminal IN, the electrostatic discharge protection device ESD1 conducts so as to allow electrostatic charge to escape in the direction from the input terminal IN to the power supply terminal VDD. On the other hand, when static electricity having a low negative potential is input to the input terminal IN, the electrostatic discharge protection device ESD2 conducts so as to allow electrostatic charge to escape in the direction from the ground terminal VSS to the input terminal IN.

Because of the existence of the above electrostatic discharge protection device ESD2, if the ground terminal VSS becomes the open condition, the electrostatic discharge protection device ESD2 conducts, and the potential of the ground wiring 16 becomes higher than the external ground potential. In the above ground open condition, the ground open detection circuit 12 detects that the potential of the ground terminal VSS and the potential of the ground wiring 16 connected thereto become higher than the external ground potential, which is applied to the input terminal IN.

To the input terminal IN, a signal having the ground potential is supplied in a normal operating condition. Namely, when the signal having the ground potential is being supplied to the input terminal IN, the ground open detection circuit 12 detects the ground open condition. Therefore, in the normal operating condition, it is desirable that a control signal having an L-level, namely, the ground potential, or a clock signal which repeats the L-level and H-level (ground potential and power supply voltage potential) are input to the input terminal IN.

Further, on detecting the ground open condition, the ground open detection circuit 12 outputs the detection signal 13 to the internal circuit 10, so as to halt the operation of the internal circuit 10. As a typical example of operational halt, a data output being output from the data input/output terminal DATA of the internal circuit 10 is fixed to either one level of H or L. Alternatively, a high impedance condition is formed. By this, it is possible to avoid producing a cause of malfunction by the output of an incorrect data to the external device in the ground open condition.

The ground open condition in which the ground terminal VSS in the chip is not electrically connected to the external ground terminal GND may be caused by that a defect occurs in the solder connection between the ground terminal GND of the circuit board 20 and the ground terminal P-VSS of the package PKG, or that a defect occurs in the connection between the ground terminal P-VSS of the package PKG and the ground terminal VSS of the chip.

Figure 2:
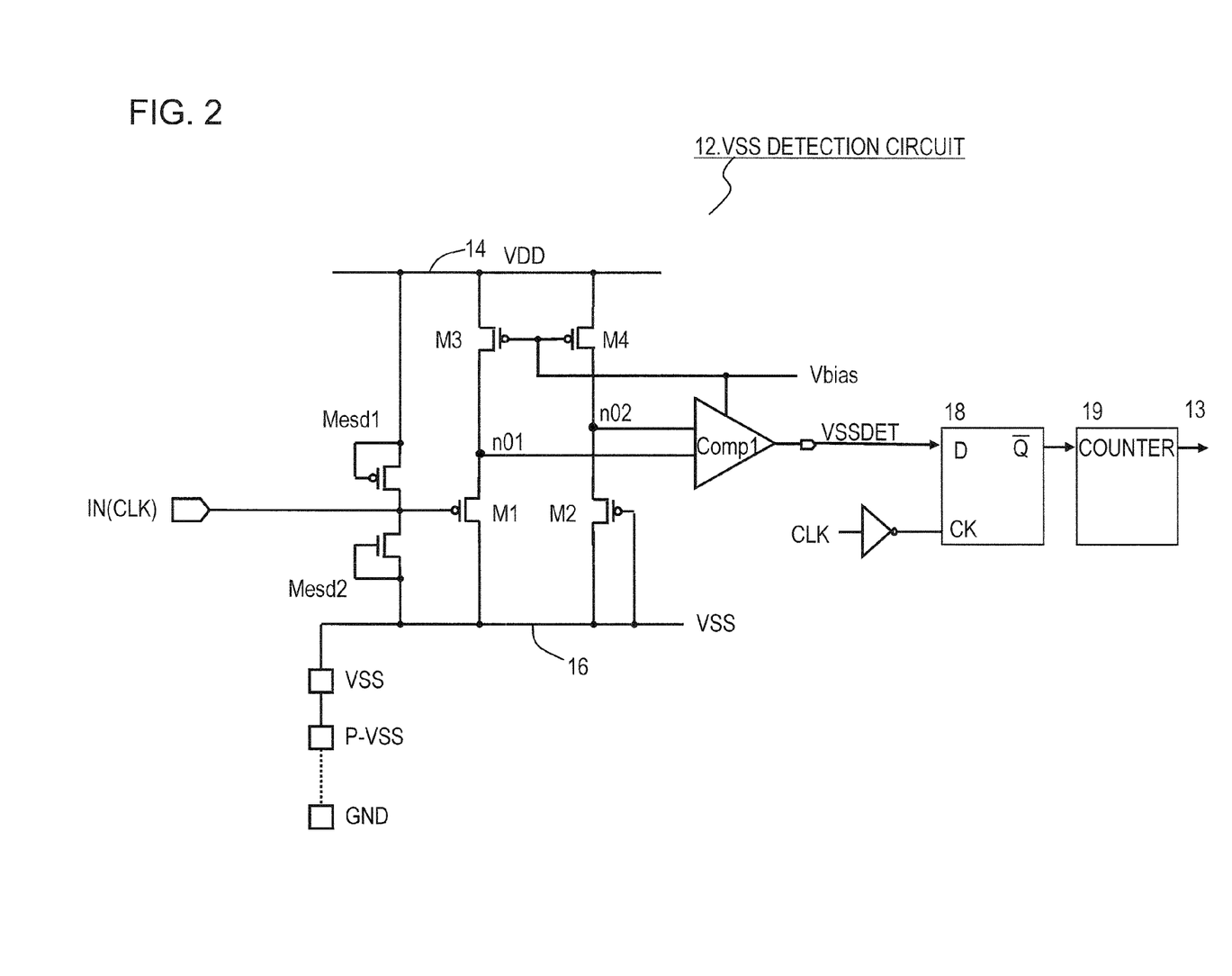
FIG. 2 is a circuit diagram illustrating a first example of the ground open detection circuit.

FIG. 2 is a circuit diagram illustrating a first example of the ground open detection circuit. As described in FIG. 1, the power supply wiring 14 is connected to the power supply terminal VDD, and the ground wiring 16 is connected to the ground terminal VSS. Hereafter, in the description of the circuit, for the sake of simplicity, the power supply terminal or the power supply wiring is simply referred to as power supply VDD, and also, the ground terminal or the ground wiring is simply referred to as ground VSS.

At the input terminal IN, between with the power supply VDD, a P-channel transistor Mesd1 having a short circuit between the gate and the drain, thereby forming a diode connection, is provided as an electrostatic discharge protection device ESD1. Also, between with the ground VSS, an N-channel transistor Mesd2 having a short circuit between the gate and the drain, thereby forming a diode connection, is provided as an electrostatic discharge protection device ESD2. In the normal operating condition, a signal having potential between the power supply VDD and the ground VSS is supplied at the input terminal IN, and therefore, neither transistors Mesd1 nor Mesd2 conducts, and normal operation is not affected.

On the other hand, as described earlier, when static electricity having a high positive potential is applied to the input terminal IN, the voltage between the source and the gate of the transistor Mesd1 exceeds the threshold of the transistor so as to conduct the transistors Mesd1, and electrostatic charge flows from the input terminal IN to the power supply terminal VDD side, so that the destruction of an circuit element in the internal circuit, to which the input terminal IN is connected, is prevented. Oppositely, when static electricity having a low negative potential is applied to the input terminal IN, the voltage between the source and the gate of the transistor Mesd2 exceeds the threshold of the transistor so as to conduct the transistor Mesd2, and electrostatic charge flows from the ground terminal VSS to the input terminal IN side, so that the destruction of an circuit element in the internal circuit, to which the input terminal IN is connected, is prevented.

The ground open detection circuit 12 includes a first transistor M1, having the gate connected to the input terminal IN, and having the source and the drain connected between the power supply terminal VDD and the ground terminal VSS; a second transistor M2, having the gate connected to the ground terminal VSS, and having the source and the drain connected between the power supply terminal VDD and the ground terminal VSS; and a comparator Comp1 for comparing potentials of nodes n01, n02 respectively located between the drains of the first and second transistors M1, M2 and the power supply terminal VDD, and for outputting a ground open detection signal VSSDET indicative of a ground open condition.

Both the first and second transistors M1, M2 are P-channel transistors, and between the respective sources thereof and the power supply VDD, there are provided current source circuits constituted of P-channel transistors M3, M4, each having the gate to which a bias voltage Vbias is supplied.

The potential of the node n01 is determined by an ON resistance ratio between the transistors M1, M3. Similarly, the potential of the node n02 is determined by an ON resistance ratio between the transistors M2, M4.

In the above example, the transistor sizes of the transistors M3, M4 are designed to be equal, and because the gate bias voltage Vbias is identical, the ON resistances $R_{M3}$, $R_{M4}$ of the transistors M3, M4 are substantially equal. On the other hand, the transistor sizes of the transistors M1, M2 are designed in such a manner that, when the gate voltages are identical, the ON resistance $R_{M1}$ of the transistor M1 becomes larger than the ON resistance $R_{M2}$ of the transistor M2 ($R_{M1}>R_{M2}$). More specifically, for example, the gate length of the transistor M1 is longer than the gate length of the transistor M2.

Accordingly, when the ground terminal VSS of the chip is correctly connected to the external ground terminal GND, the voltage $V_{n01}$ of the node n01 becomes higher than the voltage $V_{n02}$ of the node n02. Namely, $$V_{n01}=R_{M1}*VDD/(R_{M1}+R_{M3})$$

$$V_{n02}=R_{M2}*VDD/(R_{M2}+R_{M4})$$

Here, because $R_{M1}>R_{M2}$ and $R_{M3}=R_{M4}$ have been set, $V_{n01}>V_{n02}$ holds. As a result, the comparator Comp1 sets the output VSSDET to be H level. This signifies that a condition that the ground terminal VSS of the chip is connected to the external ground terminal GND is detected.

Next, an explanation will be given to an open condition in which the ground terminal VSS of the chip is not connected to the external ground terminal GND. The input terminal IN is connected to the gate of the transistor M1. Because a signal having a ground potential is input to the input terminal IN in a normal operating condition, the transistor M1 is in a conduction condition. This forms a current path by the power supply VDD, the transistor M3 and the transistor M1. Therefore, when the ground VSS of the chip becomes open, the transistor Mesd2 conducts by the above current path, and the ground terminal and the wiring VSS thereof come to have a higher potential than the ground potential of the input terminal IN, by the magnitude of the threshold voltage of the transistor Mesd2. Namely, VSS=Vth(Mesd2) is obtained.

As described above, the ground potential of the input terminal IN is applied to the gate of the transistor M1, while VSS=Vth(Mesd2) is applied to the gate of the transistor M2. Now, the transistors M1, M2 are designed in advance such that the ON resistances $R_{M1}$, $R_{M2}$ of the transistors M1, M2 in the above case become $R_{M1} < R_{M2}$. In other words, the ON resistances $R_{M1}$, $R_{M2}$ are designed in advance to have an inverse relationship to the case when the ground VSS of the chip is connected to the external ground terminal GND. Because the potential of the ground terminal and the wiring VSS in the chip is Vth (Mesd2), the potential of each node n01, n02 becomes as follows.

$$V_{n01} = R_{M1} * (VDD - Vth)/(R_{M1} + R_{M3})$$

$$V_{n02} = R_{M2} * (VDD - Vth)/(R_{M2} + R_{M4})$$

Here, because $R_{M1} < E_{M2}$ and $R_{M3} = R_{M4}$ have been set, $V_{n01} < V_{n02}$ holds. As a result, the comparator Comp1 is inverted, and the output VSSDET is set to L level accordingly. This signifies that an open condition, in which the ground terminal VSS of the chip is not connected to the external ground terminal GND, is detected.

As described above, the ON resistances of the transistors M1, M2, M3, M4 are designed in advance so that the pair of transistors M1, M2 can discriminatingly detect a condition that, when the ground terminal VSS in the chip is connected to the external ground terminal GND, the potential of the ground VSS in the chip becomes the ground potential, from a condition that, when Vss is open, the potential of the ground terminal VSS in the chip becomes Vth (Mesd2), so as to produce the inverse relationship between the nodes n01, n02. By this, the comparator Comp1 can detect the above cases discriminatingly.

Figure 3:
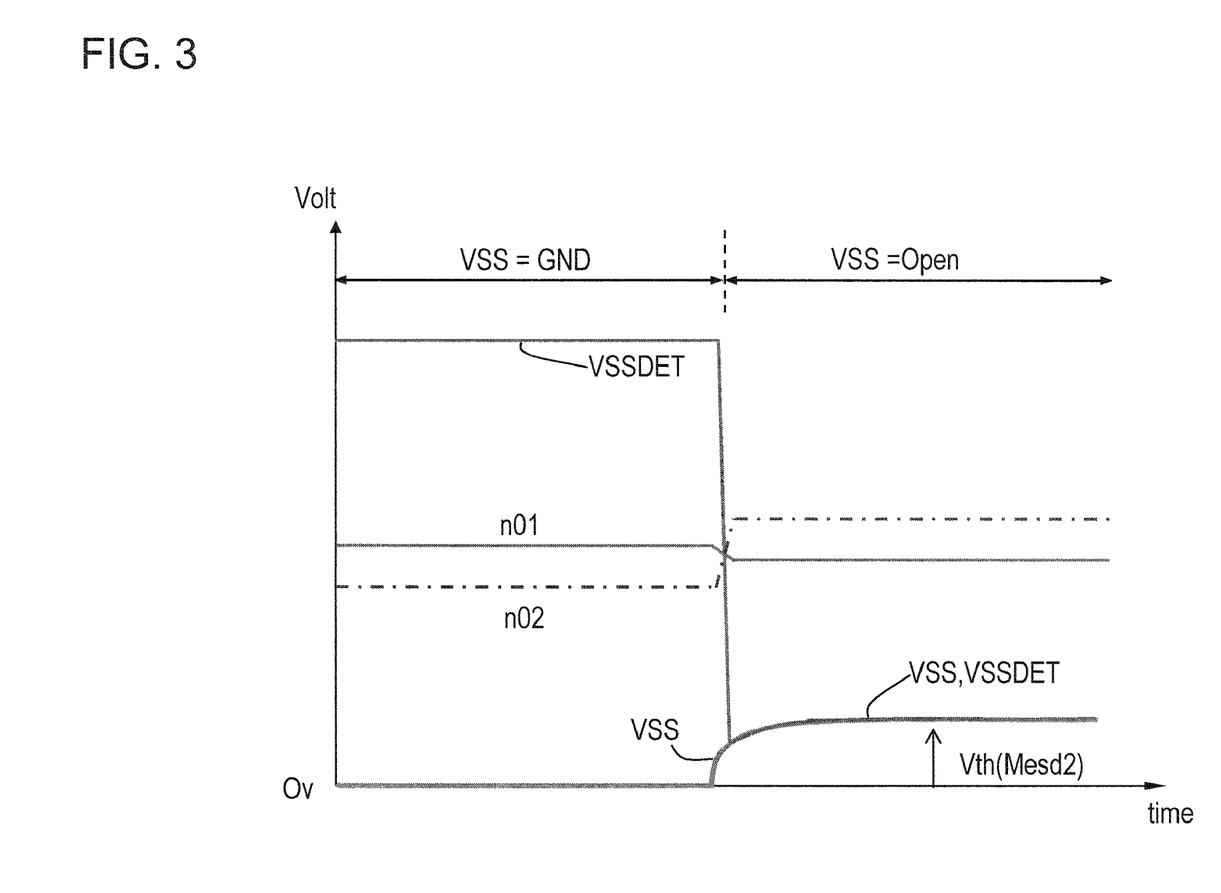
FIG. 3 is a waveform diagram illustrating the operation of the ground open detection circuit shown in FIG. 2.

FIG. 3 is a waveform diagram illustrating the operation of the ground open detection circuit shown in FIG. 2. When the ground terminal VSS in the chip is connected to the external ground terminal GND, the ground terminal VSS in the chip becomes the ground potential (0 V), so that $V_{n01} > V_{n02}$ is obtained, and the detection signal VSSDET becomes H level. On the other hand, when the ground terminal VSS in the chip is in an open condition because of not being connected to the external ground terminal GND, the ground terminal VSS in the chip becomes Vth (Mesd2), so that $V_{n01} < V_{n02}$ is obtained, and the detection signal VSSDET becomes L level. The above L level is identical to the ground potential VSS in the chip.

Referring back to FIG. 2, desirably, the signal supplied to the input terminal IN is a signal that becomes the ground potential in the normal operating condition. Alternatively, it may be possible that the signal supplied to the input terminal IN is a clock CLK. Normally, the clock CLK is an alternately repeated signal having the H-level power-supply potential and the L-level ground potential. Therefore, the output of the comparator Comp1 when the clock CLK is in L level indicates the detection result whether the ground terminal VSS has the ground potential or the open condition.

As described above, in regard to the case when the clock CLK is applied to the input terminal IN, it is desirable that, with the provision of a latch circuit 18 for latching the detection output of the comparator Comp1, the above latch circuit 18 performs latch operation at the timing when the clock CLK is in the L level. By this, it is possible to latch the comparison result of the nodes n01, n02 when the input terminal IN has the ground potential. Further, with the provision of a counter 19 for counting the inverted outputs /Q of the latch circuit 18 and for outputting a detection signal 13 to be generated when the count reaches a predetermined number, a highly reliable signal 13 for detecting the open condition can be obtained.

In the first example shown in FIG. 2, it may also be possible to replace the transistors M3, M4 with resistors having an equal resistance value.

Figure 4:
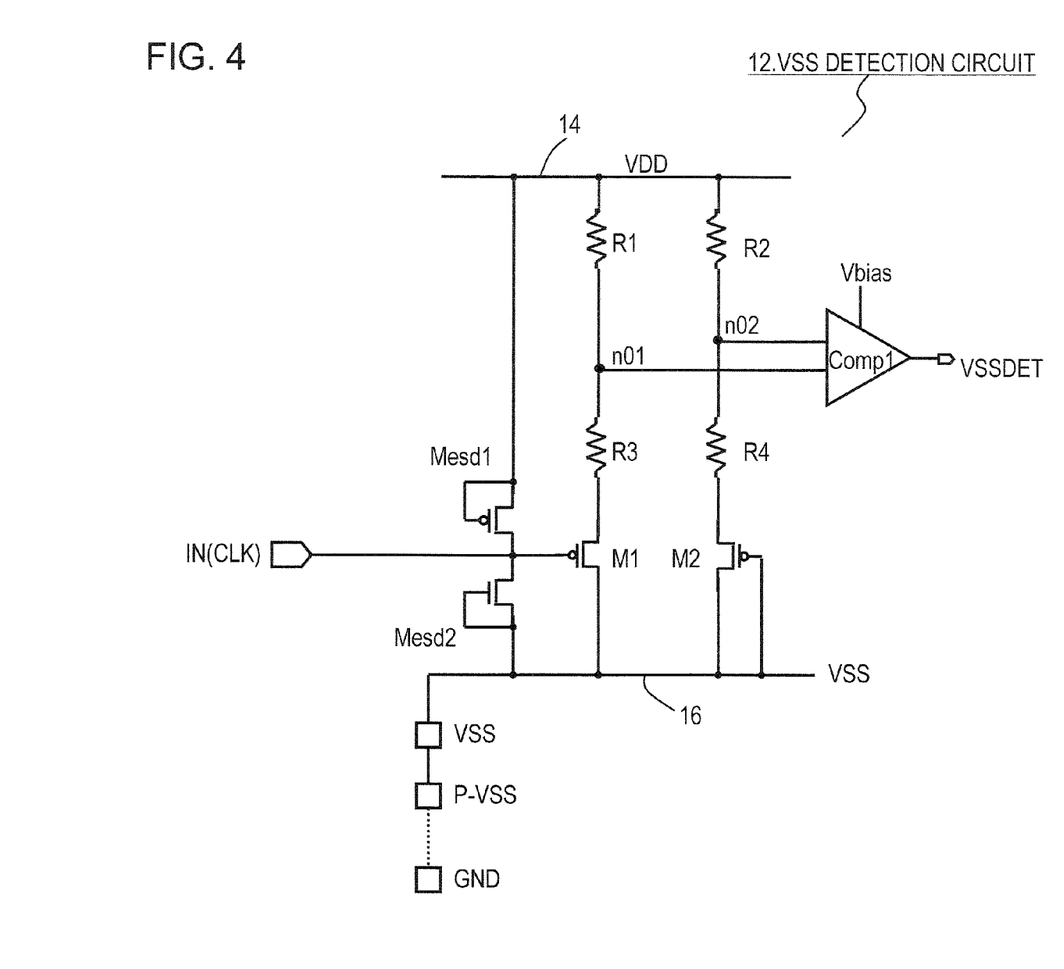
FIG. 4 is a circuit diagram illustrating a second example of the ground open detection circuit.

FIG. 4 is a circuit diagram illustrating a second example of the ground open detection circuit. A point of difference in the second example from the first example shown in FIG. 2 is that resistors R1, R2, having an equal resistance value, are provided on the power supply VDD side, and further, a resistor R3 is provided between the resistor R1 and the transistor M1, and a resistor R4 is provided between the resistor R2 and the transistor M2, respectively, in which the resistors R3, R4 are designed such that the resistance values thereof satisfy a relation of R3>R4. Further, the transistor sizes, namely the gate lengths, of the transistors M1, M2 are designed to be equal. Accordingly, when the gates of the transistors M1, M2 have the same ground potential (0 V), each ON resistance thereof becomes equal. Then, in the comparator Comp1, the connection node n01 between the resistors R1, R3 is compared with the connection node n02 between the resistors R2, R4.

In other words, in the second example shown in FIG. 4, the resistor R3 and the transistor M1 are provided in place of the transistor M1 shown in FIG. 2, and the resistor R4 and the transistor M2 are provided in place of the transistor M2 shown in FIG. 2, respectively. Other configuration is similar to FIG. 2.

In the second example shown in FIG. 4, when the ground terminal VSS in the chip is correctly connected to the external ground terminal GND, because R1=R2, R3>R4 and $R_{M1}=R_{M2}$ are satisfied, $R3+R_{M1}>R4+R_{M2}$ holds. Thus, the potential of each node n01, n02 becomes $V_{n01}>V_{n02}$. Therefore, the detection signal VSSDET by the comparator Comp1 becomes H level, which is as shown in FIG. 3.

On the other hand, when the ground terminal VSS in the chip is not correctly connected to the external ground terminal GND, namely in the open condition, the ground terminal VSS in the chip floats up by the magnitude of the threshold voltage Vth of the transistor Mesd2, and accordingly, relationship between the ON resistances of the transistors M1, M2 becomes $R_{M1}<R_{M2}$. In this case, the transistors M1, M2 and the resistors R3, R4 are designed in advance to satisfy the relationship among the transistors M1, M2 and the resistors R3, R4 as $R3+R_{M1}<R4+R_{M2}$. As a result, each potential of the node n01, n02 becomes $V_{n01}<V_{n02}$. Therefore, the detection signal VSSDET by the comparator Comp1 becomes L level, which is as shown in FIG. 3.

Also in the second example shown in FIG. 4, the signal supplied to the input terminal IN is either the signal having the ground potential (L level) in the normal operating condition, or the clock CLK. When the clock CLK is supplied, in a similar way to FIG. 2, it is desirable to provide a latch circuit 18 for latching the detection signal VSSDET of the comparator Comp1 at the timing when the clock CLK is in L level, and a counter 19 for counting it. The operation is as having been described in FIG. 2.

In the second example shown in FIG. 4, the transistor sizes of the transistors M1, M2 can be made equal, and therefore, the design becomes easier than in the first example.

Figure 5:
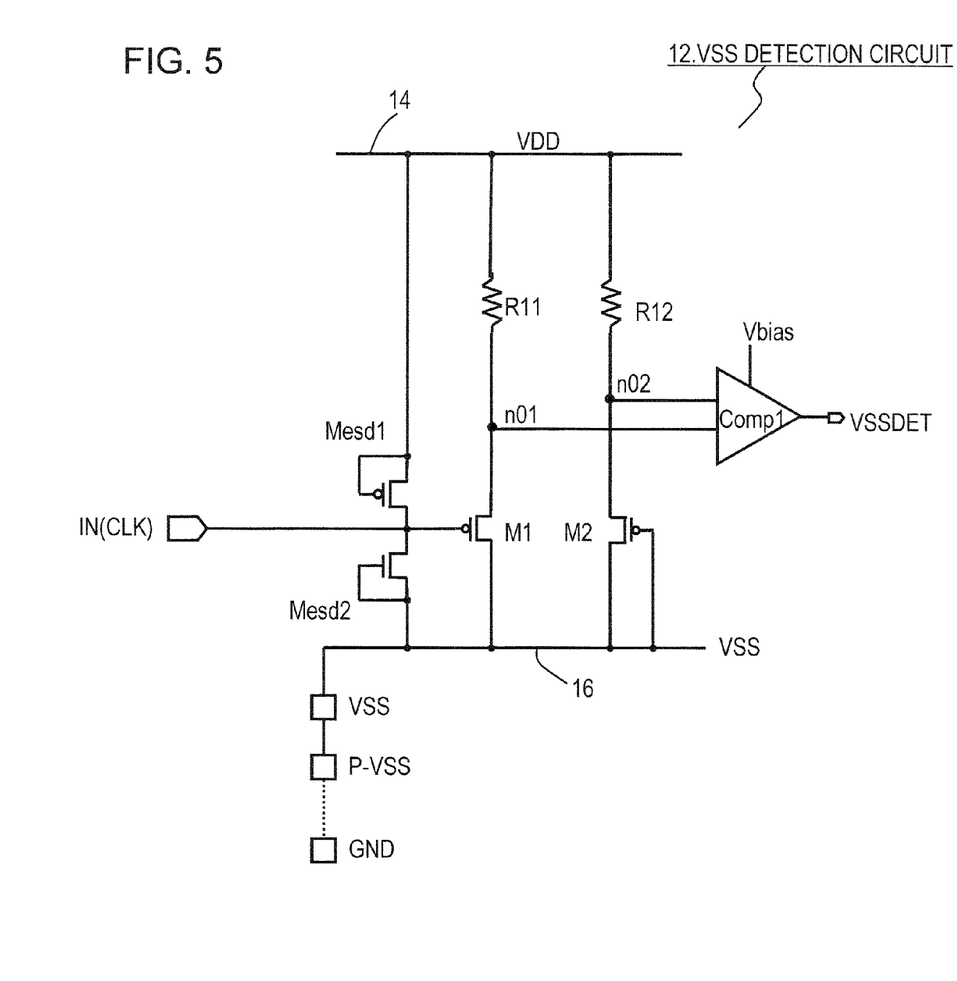
FIG. 5 is a circuit diagram illustrating a third example of the ground open detection circuit.

FIG. 5 is a circuit diagram illustrating a third example of the ground open detection circuit. In this example, resistors R11, R12 are connected to the power supply terminal VDD, a transistor M1 is connected to one terminal of the resistor R11, and a transistor M2 is connected to one terminal of the resistor R12. Further, relationship between the resistance values of the resistors R11, R12 is designed to satisfy R11<R12. Also, the transistor sizes, namely the gate lengths, of the transistors M1, M2 are designed to be equal. Therefore, when the gates of the transistors M1, M2 have the same ground potential (0 V), the ON resistances thereof become equal. Then, in a comparator Comp 1, the connection node n01 between the resistor R11 and the transistor M1 is compared with the connection node n02 between the resistor R12 and the transistor M2. Other configuration is similar to the first example.

In the third example shown in FIG. 5, when the ground terminal VSS in the chip is correctly connected to the external ground terminal GND, because R11<R12 and $R_{M1}=R_{M2}$ are satisfied, each potential of the nodes n01, n02 becomes $V_{n01}>V_{n02}$. Therefore, the detection signal VSSDET by the comparator Comp1 becomes H level, which is as shown in FIG. 3.

On the other hand, when the ground terminal VSS in the chip is not correctly connected to the external ground terminal GND, namely in an open condition, the ground terminal VSS in the chip floats up by the magnitude of the threshold voltage Vth of the transistor Mesd2, and accordingly, the relationship of the ON resistances of the transistors M1, M2 becomes $R_{M1}<R_{M2}$. In this case, the transistors M1, M2 and the resistors R11, R12 are designed in advance to have the relationship shown below:

$$V_{n01}=R_{M1}*(VDD-Vth)/(R_{M1}+R11)$$

$$V_{n02}=R_{M2}*(VDD-Vth)/(R_{M2}+R12)$$

$$V_{n01}<V_{n02}$$

Namely, it is designed in advance such that the relationship of $R_{M1}<R_{M2}$ produces $V_{n01}<V_{n02}$ even if R11<R12.

As a result, each potential of the nodes n01, n02 becomes $V_{n01}<V_{n02}$, and the detection signal VSSDET by the comparator Comp1 becomes L level, which is as shown in FIG. 3.

Also in the third example shown in FIG. 5, the signal supplied to the input terminal IN is either the signal having the ground potential (L level) in the normal operating condition, or the clock CLK. When the clock CLK is supplied, it is desirable to provide a latch circuit for latching the detection signal VSSDET of the comparator Comp1 at the timing of L level of the clock CLK, and a counter 19 for counting it, similar to FIG. 2. The operation is as described in FIG. 2.

In the third example shown in FIG. 5, the transistor sizes of the transistors M1, M2 can be made equal, and therefore, the design becomes easier than in the first example.

Figure 6:
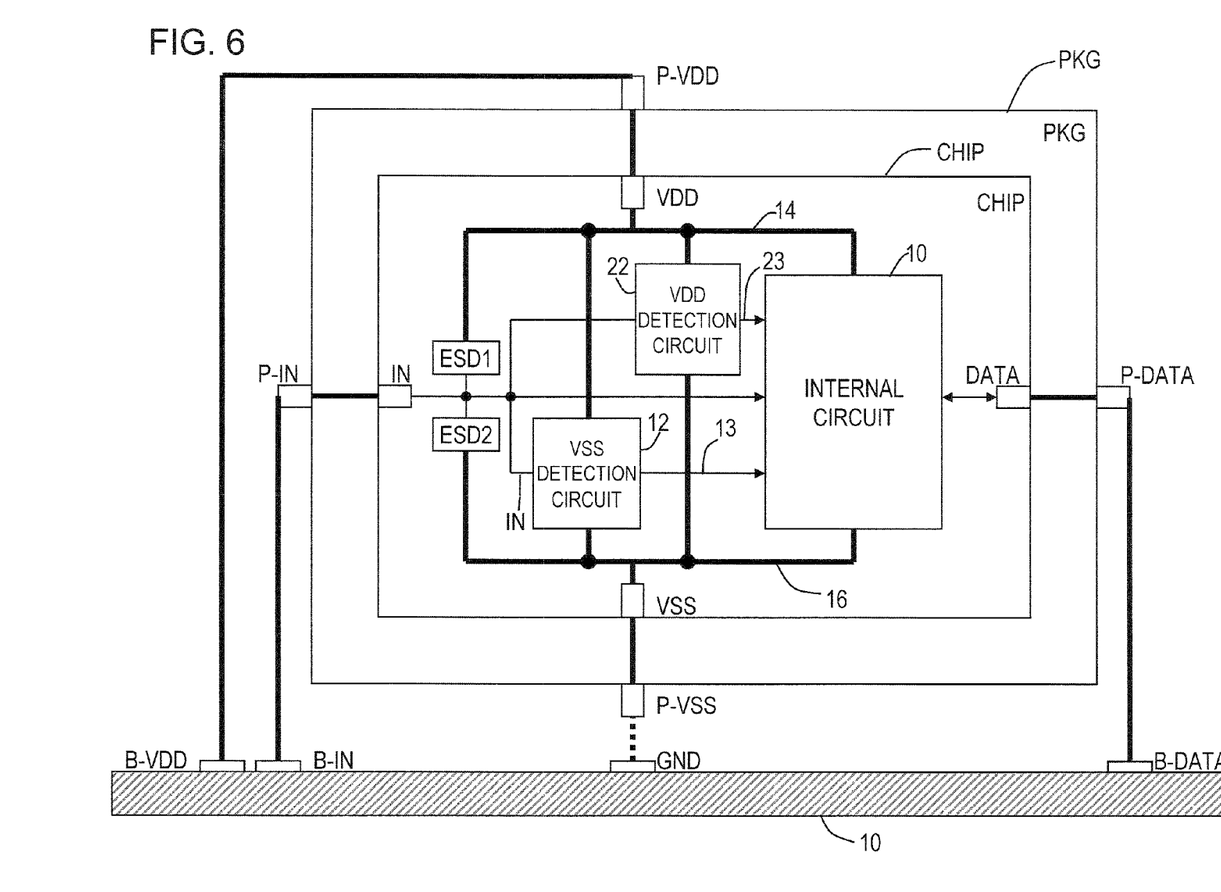
FIG. 6 is a configuration diagram of the integrated circuit device according to a second embodiment.

FIG. 6 is a configuration diagram of the integrated circuit device according to a second embodiment. This integrated circuit device includes a chip CHIP having an integrated circuit formed therein and a package PKG for accommodating the chip CHIP, similar to the first embodiment shown in FIG. 1. The chip CHIP includes power supply terminal VDD, ground terminal VSS, input terminal IN and data input/output terminal DATA. The power supply terminal VDD is connected to a power supply wiring 14, and the ground terminal VSS is connected to a ground wiring 16. Then, based on the input signal to the input terminal IN, an internal circuit 10 inputs or outputs data from/to the data input/output terminal DATA.

Further, the integrated circuit device shown in FIG. 6 includes a power-supply open detection circuit 22, in addition to the ground open detection circuit 12 shown in FIG. 1. The power-supply open detection circuit 22 detects an open condition in which the power supply VDD in the chip is not connected to the external power supply terminal B-VDD, and outputs a detection signal 23 to the internal circuit 10, so as to halt the operation of the internal circuit 10. The configuration of the ground open detection circuit 12 is identical to the first to third examples shown in the first embodiment.

Figure 7:
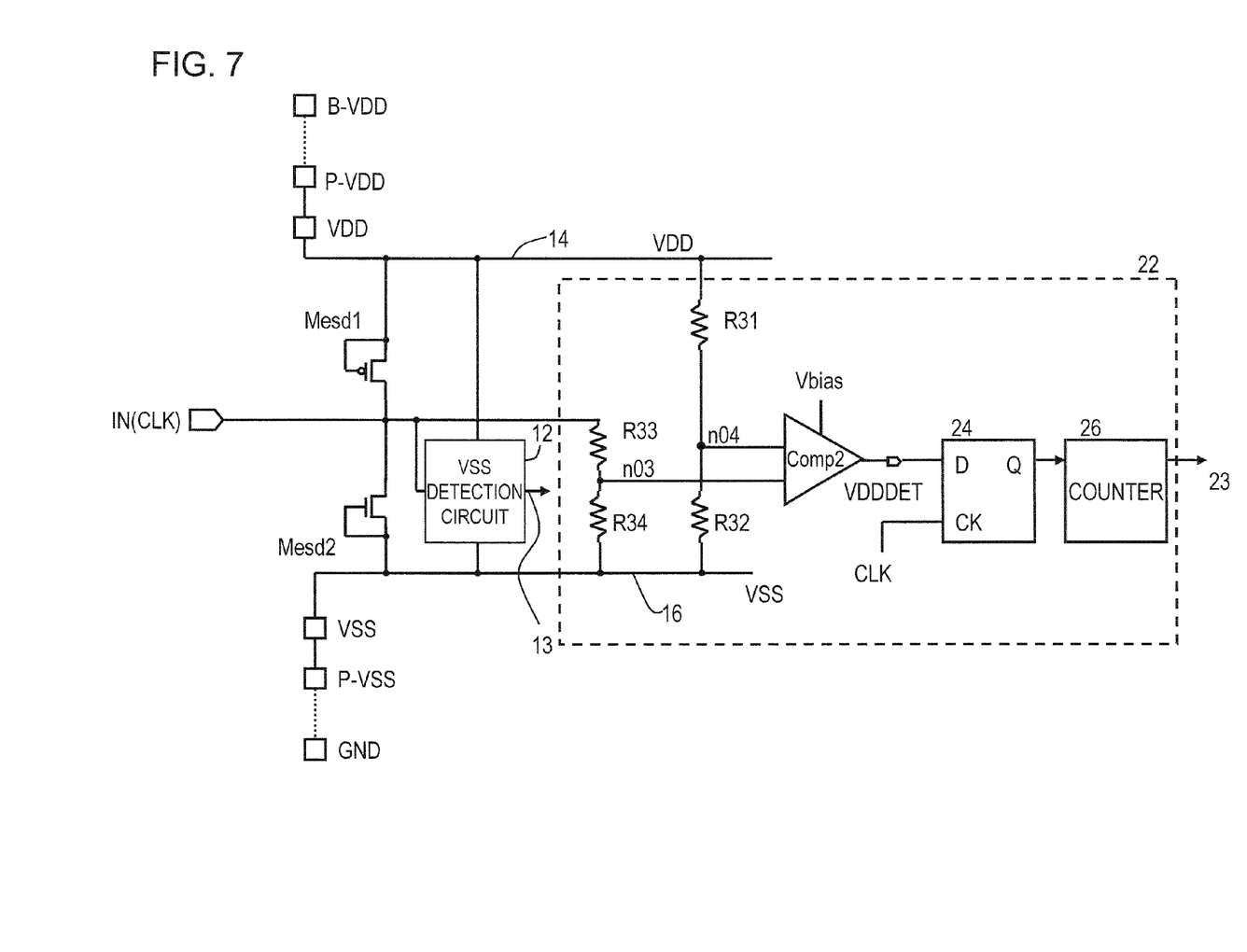
FIG. 7 is a circuit diagram of the power-supply open detection circuit 22 according to the second embodiment.

FIG. 7 is a circuit diagram of the power-supply open detection circuit 22 according to the second embodiment. The power-supply open detection circuit 22 includes resistors R31, R32 disposed between the power supply VDD and the ground terminal VSS in the chip; resistors R33, R34 disposed between the input terminal IN and the ground terminal VSS; and a comparator Comp2 for comparing connection nodes n03, n04 of the above resistors. To the input terminal IN, the potential of the power supply VDD, namely H level, is applied in a normal operating condition. Alternatively, to the input terminal IN, a clock CLK that alternately repeats the potential of the power supply VDD and the ground potential of the ground terminal VSS may be supplied in the normal operating condition. Then, the power-supply open detection circuit 22 operates when the potential of the power supply VDD is supplied to the input terminal IN.

When correctly connected to the external power supply B-VDD, the power supply terminal VDD in the chip has the potential of the power supply VDD. Because the input terminal IN cannot take other potential than the potential between VDD and VSS in the normal operating condition, the electrostatic discharge protection transistor Mesd1 is not made ON. On the other hand, when the power supply terminal VDD in the chip becomes an open condition, i.e. being not correctly connected to the external power supply B-VDD, a current path is formed via the ground terminal VSS, the resistors R32, R31 and the power supply wiring VDD, and the power supply potential is applied to the input terminal IN. Thus, the electrostatic discharge protection transistor Mesd1 is switched ON. As a result, the potential of the power supply terminal VDD in the chip decreases by the magnitude of the threshold voltage Vth(Mesd1), as compared to the external power supply potential P-VDD. In the above connection condition of the power supply terminal VDD in the chip, the power supply terminal VDD in the chip has the potential of the power supply, and is decreased to the VDD−Vth (Mesd1) when being in the open condition. The above is detected by the comparator Comp2.

For example, it is assumed that the resistors R34, R32 are designed to satisfy R34=R32, and that the resistors R31, R33 are designed to satisfy R31<R33. In the connection condition of the power supply terminal VDD in the chip, when the potential of the power supply is applied to the input terminal IN, VDD=IN is obtained, and each voltage of the nodes n03, n04 becomes Vn03<Vn04. At this time, the output VDDDET of the comparator becomes H level.

Then, when the power supply terminal VDD in the chip becomes an open condition, the potential of the power supply terminal VDD in the chip is decreased to VDD−Vth(Mesd1). The resistors R31, R32, R33, R34 are designed in advance in such a manner that, in the above condition, each voltage of the nodes n03, n04 becomes Vn03>Vn04. At this time, the output VDDDET of the comparator becomes L level.

When the clock CLK is input to the input terminal IN, the comparator output VDDDET in case of CLK=H is latched in a flip-flop 24. Then, the number of latched times of VDDDEST=L, indicative of the open condition of the power supply terminal VDD, is counted by a counter 26. When the count reaches a predetermined number, an open detection signal 23 is output.

In such a manner, it is possible to operate the ground open detection circuit 12 in parallel. As having been described in the first embodiment, the ground open detection circuit 12 latches the comparator output when the clock CLK of the input terminal IN is in L level, and when the open condition is detected for the predetermined number of times, the open detection signal 13 is output.

In case that both the VDD open detection circuit 22 according to the second embodiment and the ground open detection circuit 12 according to the first embodiment are provided, by the input of the clock CLK or the like which alternately shifts between VDD and the ground to one input terminal IN, it is possible to check the ground open condition at the time of CLK=L, and also check the VDD open condition at the time of CLK=H. Further, when any one of the open detection signals 13, 23 is output, by halting the operation of the internal circuit, it is possible to avoid outputting an incorrect operation result. Such the halt of the internal circuit may be performed by setting the output data terminal DATA to be in a high impedance condition, or to be fixed to either L level or H level. Optimum halt control is selected depending on each use.

As having been described, the integrated circuit device shown in FIGS. 6, 7 includes the chip CHIP having the power supply terminal VDD, the ground terminal VSS and the input terminal IN, and having the internal circuit 10 formed therein, and the package PKG for accommodating the chip and having the external terminals P-VDD, P-VSS, P-IN respectively connected to the ground terminal and the input terminal of the chip. Further, the chip includes the first unidirectional device ESD2 disposed between the input terminal and the ground terminal and directed from the ground terminal to the input terminal; the second unidirectional device ESD1 disposed between the input terminal and the power supply terminal and directed from the input terminal to the ground terminal; in case of the open condition in which the ground terminal of the chip is not connected to the external ground terminal, the ground open detection circuit 12 for detecting the potential difference between the input terminal and the ground terminal of the chip, and for outputting the ground open detection signal; and incase of the open condition in which the power supply terminal of the chip is not connected to the external power supply terminal, the power-supply open detection circuit 22 for detecting the potential difference between the input terminal and the power supply terminal of the chip, and for outputting the power-supply open detection signal. Further, to the input terminal IN, the clock signal CLK, in which the power supply potential and the ground potential are alternately repeated, is supplied in the normal operating condition.

In such a manner, even in case of an integrated circuit device having a limited number of external terminals, that is, only having power supply terminal P-VDD, ground terminal P-VSS, data input/output terminal P-DATA, clock terminal IN, by means of the clock terminal IN and unidirectional devices ESD1, ESD2 connected thereto for electrostatic discharge protection, it is possible to provide detection circuits 22, 12 respectively for detecting a reduced potential of the power supply terminal VDD in the chip when the connection thereof is open, and for detecting an increased potential of the ground terminal VSS in the chip when the connection thereof is open.

As having been described above, according to the present embodiment, it is possible to detect the open condition of the ground terminal VSS in the chip. Further, it is also possible to detect the open condition of the power supply terminal VDD in the chip. Moreover, even in the integrated circuit device having the limited number of external terminals, it is possible to detect, in a time division manner, the open condition of the ground terminal and the open condition of the power supply terminal.

What is claimed is:

1. An integrated circuit device comprising:
a chip having a power supply terminal, a ground terminal, an input terminal and an internal circuit,
wherein the chip comprises:
a unidirectional device disposed between the input terminal and the ground terminal and directed from the ground terminal to the input terminal; and
a ground open detection circuit including a first transistor having the gate connected to the input terminal and the source and the drain connected between the power supply terminal and the ground terminal, a second transistor having the gate connected to the ground terminal and the source and the drain connected between the power supply terminal and the ground terminal, and a comparator for comparing potentials of nodes respectively between drains of the first and second transistors and the power supply terminal, and for outputting a ground open detection signal indicative of an open condition in which the ground terminal of the chip is not connected to an external ground terminal.

2. The integrated circuit device according to claim 1,
wherein a first relationship between the resistance of the first transistor and the resistance of the second transistor when an identical potential is supplied to each gate of the first transistor and the second transistor is different from a second relationship between the resistance of the first transistor and the resistance of the second transistor when the gate potential of the second transistor is higher than the gate potential of the first transistor.

3. The integrated circuit device according to claim 2,
wherein, when an identical potential is supplied to each gate of the first transistor and the second transistor, the resistance of the first transistor is greater than the resistance of the second transistor, while when the gate potential of the second transistor is higher than the gate potential of the first transistor, the resistance of the first transistor is smaller than the resistance of the second transistor.

4. The integrated circuit device according to claim 3,
wherein the first and second transistors are P-channel transistors, and
wherein current source circuits are provided between the sources of the first and second transistors and the power supply terminal, respectively.

5. The integrated circuit device according to claim 2,
wherein, when an identical potential is supplied to each gate of the first transistor and the second transistor, the resistance of the first transistor is equal to the resistance of the second transistor, while when the gate potential of the second transistor is higher than the gate potential of the first transistor, the resistance of the first transistor is smaller than the resistance of the second transistor.

6. The integrated circuit device according to claim 5,
wherein the first and second transistors are P-channel transistors, and
wherein first and third resistors are provided between the power supply terminal and the source of the first transistor, and second and fourth resistors are provided between the power supply terminal and the source of the second transistor, and the third resistor has a greater resistance than the fourth resistor, and
wherein the comparator compares a connection node of the first and third resistors with a connection node of the second and fourth resistors.

7. The integrated circuit device according to claim 5,
wherein the first and second transistors are P-channel transistors, and
wherein a fifth resistor is provided between the power supply terminal and the source of the first transistor, and a sixth resistor is provided between the power supply terminal and the source of the second transistor, and the fifth resistor has a smaller resistance than the sixth resistor, and
wherein the comparator compares between source nodes of the first and second transistors.

8. The integrated circuit device according to claim 1 or 2, wherein, to the input terminal, a ground potential is supplied.

9. The integrated circuit device according to claim 1 or 2,
wherein, to the input terminal, a clock signal having a power supply potential and a ground potential repeated alternately is supplied.

10. An integrated circuit device comprising:
a chip having a power supply terminal, a ground terminal and an input terminal, and an internal circuit,
wherein the chip comprises:
a first unidirectional device disposed between the input terminal and the ground terminal and directed from the ground terminal to the input terminal;
a second unidirectional device disposed between the input terminal and the power supply terminal and directed from the input terminal to the power supply terminal;
in case of a ground open condition in which the ground terminal of the chip is not connected to an external ground terminal, a ground open detection circuit for detecting a potential difference between the input terminal and the ground terminal of the chip, and for outputting a ground open detection signal; and
in case of a power supply open condition in which the power supply terminal of the chip is not connected to an external power supply terminal, a power-supply open detection circuit for detecting a potential difference between the input terminal and the power supply terminal of the chip, and for outputting a power-supply open detection signal,
wherein, to the input terminal, a clock signal having a power supply potential and a ground potential repeated alternately is supplied.

11. The integrated circuit device according to claim 10,
wherein the ground open detection circuit includes a first transistor having the gate connected to the input terminal and the source and the drain connected between the power supply terminal and the ground terminal, a second transistor having the gate connected to the ground terminal and the source and the drain connected between the power supply terminal and the ground terminal, and a comparator for comparing potentials of nodes respectively between drains of the first and second transistors and the power supply terminal, and for outputting a ground open detection signal indicative of the ground open condition.

12. The integrated circuit device according to claim 11,
wherein a first relationship between the resistance of the first transistor and the resistance of the second transistor when an identical potential is supplied to each gate of the first transistor and the second transistor is different from a second relationship between the resistance of the first transistor and the resistance of the second transistor when the gate potential of the second transistor is higher than the gate potential of the first transistor.

* * * * *